(12) United States Patent
Fujiwara et al.

(10) Patent No.: US 9,400,316 B2
(45) Date of Patent: Jul. 26, 2016

(54) ELECTRIC CURRENT-SPIN CURRENT CONVERSION DEVICE

(75) Inventors: Kohei Fujiwara, Wako (JP); Yasuhiro Fukuma, Wako (JP); Jobu Matsuno, Wako (JP); Yoshichika Otani, Wako (JP); Hidenori Takagi, Wako (JP)

(73) Assignee: RIKEN, Wako-shi (JP)

( * ) Notice: Subject to any disclaimer, the term of this patent is extended or adjusted under 35 U.S.C. 154(b) by 386 days.

(21) Appl. No.: 13/819,307

(22) PCT Filed: May 23, 2011

(86) PCT No.: PCT/JP2011/061752
§ 371 (c)(1),
(2), (4) Date: Feb. 26, 2013

(87) PCT Pub. No.: WO2012/026168
PCT Pub. Date: Mar. 1, 2012

(65) Prior Publication Data
US 2013/0154633 A1 Jun. 20, 2013

(30) Foreign Application Priority Data
Aug. 27, 2010 (JP) .................................. 2010-191414

(51) Int. Cl.
*H01L 43/04* (2006.01)
*G01R 33/07* (2006.01)
(Continued)

(52) U.S. Cl.
CPC ........ *G01R 33/075* (2013.01); *H01L 29/66984* (2013.01); *H01L 29/82* (2013.01); *H01L 43/06* (2013.01)

(58) Field of Classification Search
CPC ............. G01R 33/093; G01R 33/1284; G01R 33/0322; G01R 33/00; B82Y 25/00; H01L 43/08; H01L 43/06; H01L 43/14; H01L 27/228; H01L 43/04; H01L 43/065; H01F 10/3286; H01M 4/8605; G11C 11/18; C25B 11/00
USPC ......................................... 324/251, 244, 252
See application file for complete search history.

(56) References Cited

U.S. PATENT DOCUMENTS 3,397,331 A * 8/1968 Burkhard ............... H02K 44/10
310/11
7,704,919 B2 * 4/2010 Adzic et al. ................... 502/344
(Continued)

FOREIGN PATENT DOCUMENTS

JP 2004186274 7/2004
JP 2004342241 12/2004
(Continued)

OTHER PUBLICATIONS

"Giant spin Hall effect in perpendicularly spin-polarized FePt/Au devices" Nature Materials, vol. 7, pp. 125-129; Jan. 13, 2008.*
(Continued)

*Primary Examiner* — Arleen M Vazquez
*Assistant Examiner* — Alesa Allgood
(74) *Attorney, Agent, or Firm* — Knobbe, Martens, Olson & Bear, LLP

(57) ABSTRACT

An electric current-spin current conversion device according to the invention performs conversion between electric current and spin current utilizing the spin Hall effect or the inverse spin Hall effect of a 5d transition metal. A spin accumulation apparatus according to the invention includes a non-magnetic body in which injected spins are accumulated and an injection unit that injects spins into the non-magnetic body, wherein said injection unit comprises said electric current-spin current conversion device provided on said non-magnetic body, and an electric power source that supplies an electric current to said electric current-spin current conversion device in such a way that a spin current flowing toward said non-magnetic body is generated by the spin Hall effect.

4 Claims, 6 Drawing Sheets

(51) Int. Cl.
*H01L 29/66* (2006.01)
*H01L 29/82* (2006.01)
*H01L 43/06* (2006.01)

(56) References Cited

U.S. PATENT DOCUMENTS

| | | | | |
|---|---|---|---|---|
| 8,421,060 | B2 * | 4/2013 | Koo | H01L 29/66984 257/192 |
| 2008/0151615 | A1 * | 6/2008 | Rodmacq | B82Y 25/00 365/173 |
| 2010/0072993 | A1 * | 3/2010 | Pan | B82Y 25/00 324/301 |
| 2012/0138887 | A1 * | 6/2012 | Zhang | H01L 31/08 257/9 |

FOREIGN PATENT DOCUMENTS

| | | |
|---|---|---|
| JP | 2005019561 | 1/2005 |
| JP | 2005135462 | 5/2005 |
| JP | 2007155854 | 6/2007 |
| JP | 2007294710 | 11/2007 |
| JP | 2009146512 | 7/2009 |
| JP | 2009295824 | 12/2009 |
| JP | 2010003850 | 1/2010 |

OTHER PUBLICATIONS

"Quantum Spin Hall Effect in Transition Metal Oxide Na.sub.2IrO.sub.3", Shitade et al., The American Physical Society, Physical Review Letters, Jun. 26, 2009.*

"Giant spin Hall effect in perpendicularly spin-polarized FePt/Au devices" Seki et al. Nature Materials, vol. 7, pp. 125-129; Jan. 13, 2008.*

Study of intrinsic spin Hall effect and orbital Hall effect in 4d- and 5d-transition metals. Tanaka et al. Nov. 8, 2007.*

Complex orbital state stabilized by strong spin-orbit coupling in a metallic iridium oxide IrO2. Hirata et al. Nov. 26, 2012.*

S. O. Valenzuela and M. Tinkham "Direct electronic measurement of the spin Hall Effect" Nature, vol. 442, pp. 176-179 (2006).

T. Kimura, Y. Otani, T. Sato, S. Takahashi and S. Maekawa "Room-Temperature Reversible Spin Hall Effect" Physical Review Letters, vol. 98, pp. 156601-1-4 (2007).

L. Vila, T. Kimura, Y. Otani "Evolution of Spin Hall Effect in Pt Nanowires: Size and Temperature Effects" Phyiscal Review Letters, vol. 99, pp. 226604-1-4 (2007).

T. Seki, Y. Hasegawa, S. Mitani, S. Takahashi, H. Imamura, S. Maekawa, J. Nitta and K. Takanasi "Giant spin Hall effect in perpendicularly spin-polarized FePt/Au devices" Nature Materials, vol. 7, pp. 125-129 (2008).

Y. Otani and T. Kimura "Spin Hall Effect in Spintronics" Magune (Journal of the Magnetics Society of Japan), vol. 4, pp. 66-72 (2009) and its English translation.

T. Kimura, Y. Otani, L. Vila "Spin current absorption and spin Hall effects in ferromagnetic/nonmagnetic hybrid structures (invited)" Journal of Applied Physics, vol. 103, pp. 07F310-1-4 (2008).

G. Mihajlovic, J. E. Pearson, M. A. Garcia, S. D. Bader and A. Hoffmann "Negative Nonlocal Resistance in Mesoscopic Gold Hall Bars: Absence of the Giant Spin Hall Effect" Physical Review Letters, vol. 103. pp. 166601-1-4 (2009).

A. Shitade et al., Quantum Spin Hall Effect in a Transition Metal Oxide Na$_2$IrO$_3$, Physical Review Letters, Jun. 24, 2009, vol. 102, p. 256403-1-256403-4.

H. Kuriyama et al., Epitaxially stabilized iridium spinel oxide without cations in the tetrahedral site, Applied Physics Letters, May 4, 2010, vol. 96, p. 182103-1-182103-3.

Publication with International Search Report in WO 2012/026168, dated Jan. 3, 2012.

* cited by examiner (a)

(b)

(a)

$\Delta R_{without} = 0.24 m\Omega$ (b)

$\Delta R_{with} = 0.19 m\Omega$

ELECTRIC CURRENT-SPIN CURRENT CONVERSION DEVICE

TECHNICAL FIELD

The present invention relates to an electric current-spin current conversion device that performs conversion between electric current and spin current utilizing the spin Hall effect or the inverse spin Hall effect.

BACKGROUND ART

High functionality devices utilizing the spin of the electron are called spintronic devices and expected to provide a new technology that will surmount limits of conventional semiconductor devices. Technologies pertaining to spintronic devices are disclosed in, for example, patent documents 1 to 9.

Nowadays, spin current that does not involve electric current (pure spin current) has been attracting attention, as new functionalities of spintronic devices and techniques for generating, transporting, detecting it have been gradually developed.

For example, according to an existing method, electric current flowing in the interface between a non-magnetic material and a ferromagnetic material generates a pure spin current. Specifically, a thin non-magnetic wire is kept in contact with a ferromagnetic body. As an electric current flows in the interface of the non-magnetic material and the ferromagnetic material, a spin polarized current (pure spin current+electric current) flows from the ferromagnetic material into the non-magnetic material. If only one side of the thin non-magnetic wire forms a closed circuit with the current source, an electric current flows in the circuit side thin non-magnetic wire, while no current flows in the other side thereof. However, a spin current injected from the ferromagnetic material diffuses toward both sides of the thin wire even in a portion where there is no electric, current flows. This is called a pure spin current. One method of generating/detecting a pure spin current is a method utilizing the spin Hall effect of non-magnetic materials. Technologies pertaining to the spin Hall effect are disclosed in, for example, non-patent documents 1 to 6.

Heretofore, 5d transition metals such as Pt have been usually used to generate/detect a pure spin current utilizing the spin Hall effect. However, the conversion efficiency (i.e. the efficiency of conversion between electric current and spin current) with them is very low. It has been reported that a very high conversion efficiency was achieved with the use of Au, but the inventors of the present invention and other researchers have not been able to achieve such a high conversion efficiency with Au (non-patent document 7). Thus, data about Au lacks reproducibility (reliability), and it is considered that the conversion efficiency is highest with Pt.

In existing spintronic devices, ferromagnetic bodies are used as spin injection sources and spin detection sources. However, with a decrease in the device size, the distance between ferromagnetic bodies used as spin injection and spin detection sources also have been decreased, and it is also necessary that the size of the ferromagnetic bodies themselves be made small. This will cause magnetostatic coupling between the ferromagnetic bodies, which can adversely affect the operation characteristics (in particular, magnetic field response) of the device. The utilization of the spin Hall effect or the inverse spin Hall effect of a non-magnetic material in spin injection and spin detection will eliminate this problem. However, there is a problem of low conversion efficiency with the conventionally used materials.

CITATION LIST

Patent Literature

[Patent Document 1]
Japanese Patent Application Laid-Open No. 2004-186274
[Patent Document 2]
Japanese Patent Application Laid-Open No. 2004-342241
[Patent Document 3]
Japanese Patent Application Laid-Open No. 2005-19561
[Patent Document 4]
Japanese Patent Application Laid-Open No. 2005-135462
[Patent Document 5]
Japanese Patent Application Laid-Open No. 2007-155854
[Patent Document 6]
Japanese Patent Application Laid-Open No. 2007-294710
[Patent Document 7]
Japanese Patent Application Laid-Open No. 2009-146512
[Patent Document 8]
Japanese Patent Application Laid-Open No. 2009-295824
[Patent Document 9]
Japanese Patent Application Laid-Open No. 2010-3850

Non-Patent Literature

[Non-Patent Document 1]
S. O. Valenzuela and M. Tinkham "Direct electronic measurement of the spin Hall effect" Nature, vol. 442, pp. 176-179 (2006).
[Non-Patent Document 2]
T. Kimura, Y. Otani, T. Sato, S. Takahashi and S. Maekawa "Room-Temperature Reversible Spin Hall Effect" Physical Review Letters, vol. 98, pp. 156601-1-4 (2007).
[Non-Patent Document 3]
L. Vila, T. Kimura, Y. Otani "Evolution of Spin Hall Effect in Pt Nanowires: Size and Temperature Effects" Physical Review Letters, vol. 99, pp. 226604-1-4 (2007).
[Non-Patent Document 4]
T. Seki, Y. Hasegawa, S. Mitani, S. Takahashi, H. Imamura, S. Maekawa, J. Nitta and K. Takanasi "Giant spin Hall effect in perpendicularly spin-polarized FePt/Au devices" Nature Materials, vol. 7, pp. 125-129 (2008).
[Non-Patent Document 5]
Y. Otani and T. Kimura "Spin Hall Effect in Spintronics" MAGUNE (Journal of The Magnetics Society of Japan), vol. 4, pp. 66-72 (2009).
[Non-Patent Document 6]
T. Kimura, Y. Otani, L. Vila "Spin current absorption and spin Hall effects in ferromagnetic/nonmagnetic hybrid structures (invited)" Journal of Applied Physics, vol. 103, pp. 07F310-1-4 (2008).
[Non-Patent Document 7]
G. Mihajlovic, J. E. Pearson, M. A. Garcia, S. D. Bader and A. Hoffmann"Negative Nonlocal Resistance in Mesoscopic Gold Hall Bars: Absence of the Giant Spin Hall Effect" Physical Review Letters, vol. 103, pp. 166601-1-4 (2009).

SUMMARY OF INVENTION

Technical Problem

An object of the present invention is to provide an electric current-spin current conversion device that performs conversion between electric current and spin current utilizing the spin Hall effect or the inverse spin Hall effect at high conversion efficiency and to provide an apparatus using such a device.

Solution to Problem

An electric current-spin current conversion device according to the present invention is characterized in that conversion between electric current and spin current is performed utilizing the spin Hall effect or the inverse spin Hall effect of a 5d transition metal oxide.

With the above-described feature, it is possible to provide an electric current-spin current conversion device having high conversion efficiency. It is considered that spin-orbit interaction is relevant to diffusion and scattering of spin current, which is a cause of the spin Hall effect. Specifically, in the case of a material in which the Fermi surface (conduction electrons) is constituted by an orbital having a large orbital angular momentum such as a 5d orbital, spin current in the material is greatly scattered due to strong spin-orbit interaction. In the case of 5d transition metal oxides, spin current in the material is considered to be scattered greatly, because its Fermi surface is constituted only by the 5d orbital. It is considered that the electric current-spin current conversion device with the above feature can have high conversion efficiency for this reason.

The 5d transition metal oxide may be, for example, a 5d transition metal oxide containing Ir.

A spin accumulation apparatus according to the present invention is characterized by comprising a non-magnetic body in which injected spins are accumulated and an injection unit that injects spins into said non-magnetic body, wherein said injection unit comprises the aforementioned electric current-spin current conversion device provided on said non-magnetic body, and an electric power source that supplies an electric current to said electric current-spin current conversion device in such a way that a spin current flowing toward said non-magnetic body is generated by the spin Hall effect.

A spin accumulation amount measuring apparatus according to the present invention is characterized by comprising a non-magnetic body in which injected spins are accumulated, an injection unit that injects spins into said non-magnetic body, and a measuring unit that measures the amount of spins accumulated in said non-magnetic body, wherein said measuring unit comprises the aforementioned electric current-spin current conversion device provided on said non-magnetic body, and a sensor that measures, as the amount of spins, electric current generated by the inverse spin Hall effect of the electric current-spin current conversion device.

A high frequency spin wave generating apparatus according to the present invention is characterized by comprising the aforementioned electric current-spin current conversion device, a magnetic body provided on said electric current-spin current conversion device, and an electric power source that supplies an electric current to said electric current-spin current conversion device in such a way that a spin current flowing toward said magnetic body is generated by the spin Hall effect.

A spin wave detection apparatus according to the present invention is characterized by comprising a magnetic body, a supply unit that supplies energy for generating a spin wave in said magnetic body, and a detection unit that detects the spin wave generated in said magnetic body, wherein said detection unit comprises the aforementioned electric current-spin current conversion device provided on said magnetic body, and a sensor that detects, as said spin wave, electric current generated by the inverse spin Hall effect of the electric current-spin current conversion device.

As described above, the electric current-spin current conversion device according to the present invention can be used in place of a conventional ferromagnetic body in a spin accumulation apparatus, a spin accumulation amount measuring apparatus, a high frequency spin wave generating apparatus, and a spin wave detection apparatus. Thus, there can be provided apparatuses free from the problem of magnetostatic coupling or the problem of leakage magnetic field through an end of the ferromagnetic body.

Advantageous Effects of Invention

According to the present invention, there can be provided an electric current-spin current conversion device that performs conversion between electric current and spin current utilizing the spin Hall effect or the inverse spin Hall effect at high conversion efficiency and to provide an apparatus using such a device.

BRIEF DESCRIPTION OF DRAWINGS

FIG. 2(a) shows a device without an $IrO_2$ wire, and FIG. 2(b) shows a device having an $IrO_2$ wire.

FIG. 3(a) shows an exemplary result of measurement of the spin accumulation amount with the device shown in FIG. 2(a), and FIG. 3(b) shows the result of measurement of the spin accumulation amount with the device shown in FIG. 2(b).

DESCRIPTION OF EMBODIMENTS (Spin Hall Effect and Inverse Spin Hall Effect)

Figure 1:
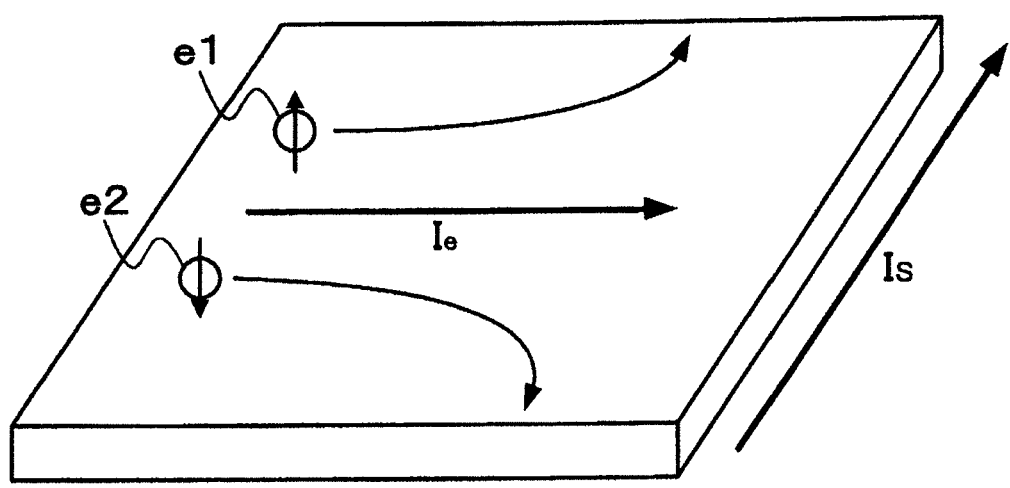
FIG. 1 is a schematic diagram illustrating the spin Hall effect and the inverse spin Hall effect.

Here, the spin Hall effect and the inverse spin Hall effect will be explained. As shown in FIG. 1, as an electric current $I_e$ flows in a non-magnetic material, electrons having up spin (up spin electrons e1) and electrons having down spin (down spin electrons e2) are deflected in directions opposite to each other by the spin-orbit interaction. As a consequence, a spin current $I_s$ (pure spin current) perpendicular to both the direction of the electric current $I_e$ and the direction of the spin is generated. This phenomenon (or effect) is called the spin Hall effect. On the other hand, as a spin current $I_s$ flows in a non-magnetic material, an electric current $I_e$ flowing in a direction perpendicular to both the direction of the spin current $I_s$ and the direction of spin is generated. This phenomenon is called the inverse spin Hall effect. Thus, conversion between electric current and spin current can be achieved by utilizing the spin Hall effect or the inverse spin Hall effect. Devices (non-magnetic materials) performing such conversion are called electric current-spin current conversion devices. In the spin Hall effect and the inverse spin Hall effect, the electric current $I_e$ and the spin current $I_s$ are in the relationship expressed by the following formula (1):

[Math. 1]

$$I_s \propto s \times I_e \tag{1}$$

where s is the direction of spin (direction of magnetization).

The efficiency of conversion between electric current and spin current (diffusion of spin current) performed according to the relationship of formula (1) is expected to depend on the magnitude of the spin-orbit interaction. Specifically, higher conversion efficiencies are expected to be achieved with materials with stronger spin-orbit interaction. Therefore, the inventors of the present invention focused on $IrO_2$ as a material having strong spin-orbit interaction and investigated the spin Hall effect of $IrO_2$. A detailed description will be given in the following.

(Measurement of Spin Diffusion Length)

When the spin Hall effect or the inverse spin Hall effect of a non-magnetic material is utilized to inject or detect spins, it is preferred that the spin diffusion length of the non-magnetic material be small (short). The spin diffusion length is the distance over which the state of spin is maintained (or the distance through which spin relaxes).

Figure 2:
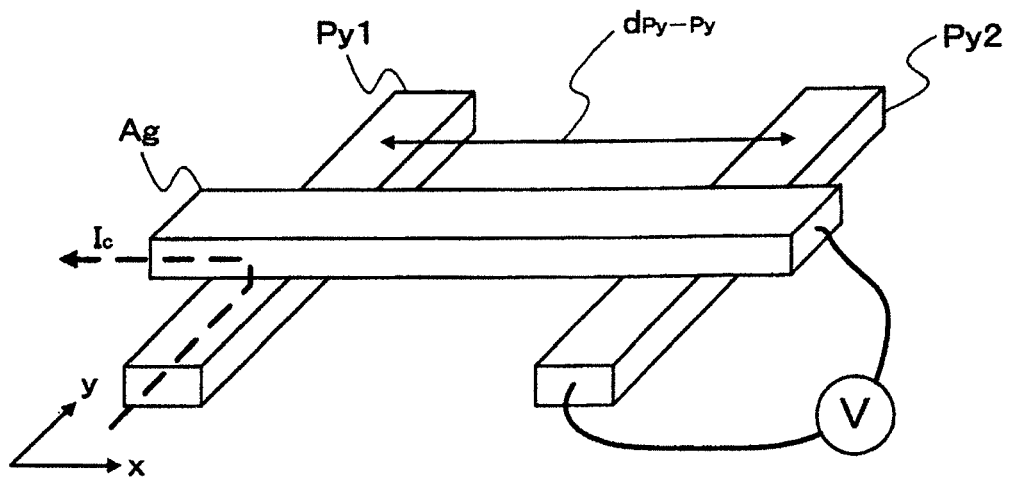
FIG. 2 includes schematic diagrams showing exemplary devices for measuring the spin diffusion length of $IrO_2$, where
Figure 2:
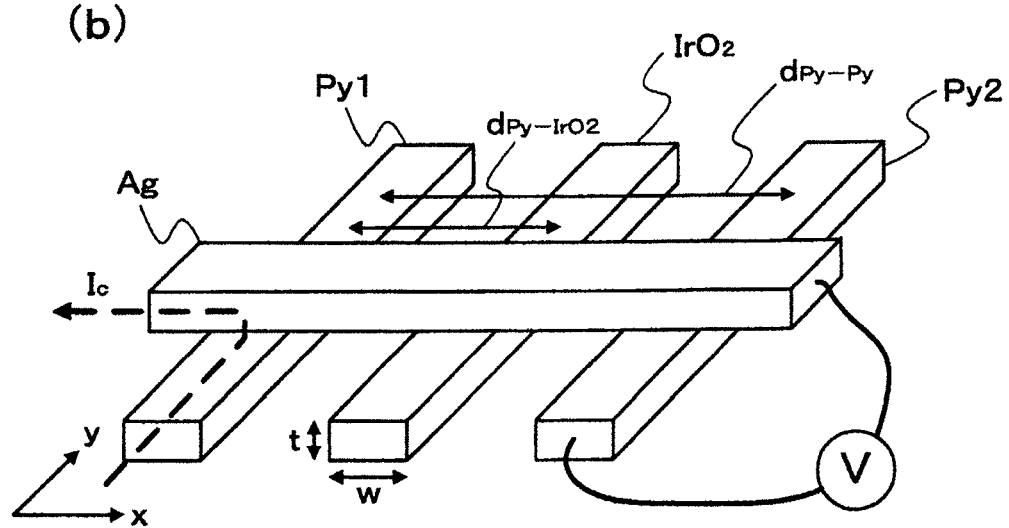

The inventors of the present invention made a device shown in FIG. 2 and measured the spin diffusion length of $IrO_2$.

The device shown in FIG. 2(a) has a structure including two ferromagnetic wires bridged by a non-magnetic wire. In this embodiment, wires made of Permalloy (Py1 wire and Py2 wire) were used as the ferromagnetic wires, and a wire made of Ag (Ag wire) was used as the non-magnetic wire. The device shown in FIG. 2(b) has a structure similar to the device shown in FIG. 2(a) but is augmented to include a wire made of $IrO_2$ ($IrO_2$ wire). Specifically, the $IrO_2$ wire is connected to the Ag wire at a position between the Py1 wire and the Py2 wire. In this embodiment, an $IrO_2$ wire having a thickness t of 10 nm and a width w of 170 nm was used. The distance $d_{py-py}$ from the point of connection of the Ag wire and the Py1 wire to the point of connection of the Ag wire and the Py2 wire was 700 nm, and the distance $d_{py-IrO2}$ from the point of connection of the Ag wire and the Py1 wire to the point of connection of the Ag wire and the $IrO_2$ wire was 350 nm.

In the exemplary devices shown in FIG. 2, as an electric current $I_c$ is caused to flow from the Py1 wire to the Ag wire, spins are injected from the Py1 wire into the Ag wire. The amount of spin accumulation in the Ag wire (spin accumulation amount) can be measured by measuring the potential difference between the Ag wire and the Py2 wire.

Figure 3:
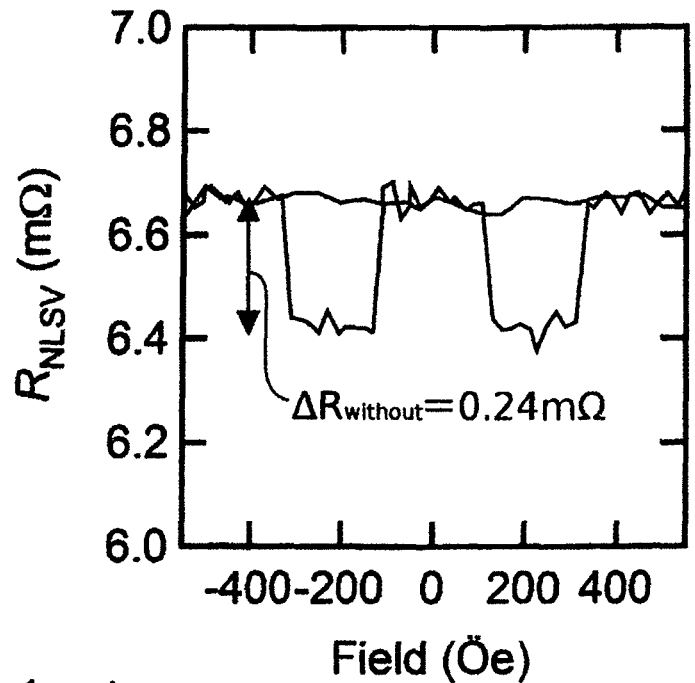
FIG. 3 shows an exemplary result of measurement of the spin accumulation amount in an Ag wire in the devices shown in FIG. 2.
Figure 3:
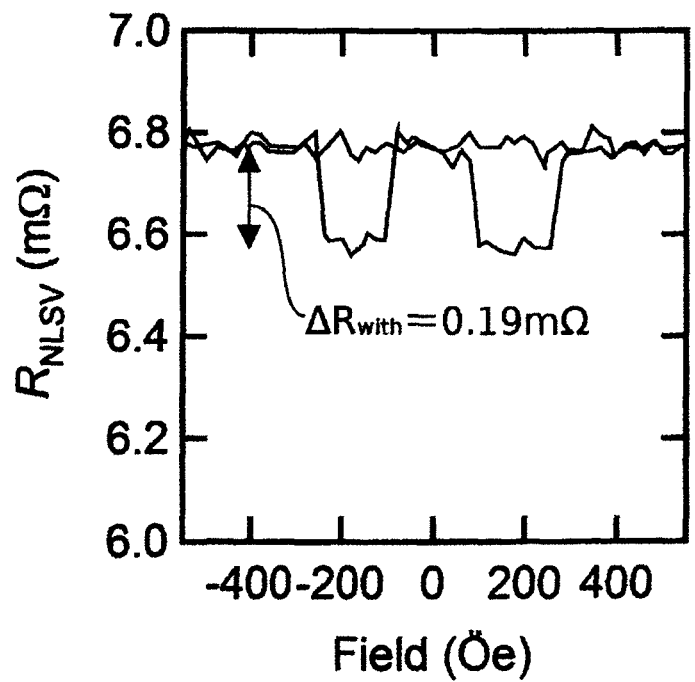

FIG. 3 shows the result of measurement of the spin accumulation amount. FIGS. 3(a) and 3(b) show the result of measurement of the spin accumulation amount in the devices shown in FIGS. 2(a) and 2(b) respectively. In FIG. 3, the horizontal axis (Field) represents the intensity of the magnetic field (in the y-direction in FIG. 2) applied to control the direction of magnetization of the Py1 wire, and the vertical axis ($R_{NLSV}$) represents the value of the measured potential difference divided by the electric current $I_c$.

In FIG. 3, $\Delta R_{with}$ and $\Delta R_{without}$ correspond to the amount of spin accumulation in the Ag wire. The reason why $\Delta R_{with}$ is smaller than $\Delta R_{without}$ is that the spins accumulated in the Ag wire were absorbed by the $IrO_2$ wire.

The spin diffusion length $\lambda_{IrO2}$ of the $IrO_2$ can be calculated using the following equations (2-1) and (2-2) (non-patent document 3).

[Math. 2]

$$\lambda_{IrO2} = \frac{S}{\rho_{IrO2}} \frac{\left(\cosh\left(\frac{d_{Py-Py}}{\lambda_{Ag}}\right) - 1\right)}{\left(1 - \frac{\Delta R_{with}}{\Delta R_{without}}\right)\sinh\left(\frac{d_{Py-Py}}{\lambda_{Ag}}\right)} \frac{\Delta R_{with}}{\Delta R_{without}} R_{Ag} \tag{2-1}$$

[Math. 3]

$$R_{Ag} = \frac{\rho_{Ag} \lambda_{Ag}}{S}, \tag{2-2}$$

where S is the cross sectional area of the contact between the Ag wire and the $IrO_2$ wire, $\rho_A$ is the electric resistivity of material A, $\lambda_A$ is the spin diffusion length of material A, $R_A$ is the spin resistance of material A (which is an index representing how easily the material A conducts spin current). The value of $\rho_{IrO2}$ is $2\times10^{-4}$ Ωcm, the value of $\rho_{Ag}$ is $3\times10^{-6}$ Ωcm, and the value of $\lambda_{Ag}$ is 330 nm. In this experiment, the value of S was $2.9\times10^{-10}$ cm$^2$. From this experiment, the value of the spin diffusion length $\lambda_{IrO2}$ of $IrO_2$ was determined to be approximately 15 nm, which is of the same order as that of Pt (~10 nm). This suggests that $IrO_2$ is a promising material for use in electric current-spin current conversion devices.

(Detection of Inverse Spin Hall Effect)

In the device shown in FIG. 2(b), as a spin current is absorbed by the $IrO_2$ wire, an electric current $I_e$ flows in the $IrO_2$ wire by the inverse spin Hall effect. Specifically, if the direction of spin of the spin current absorbed by the $IrO_2$ wire is the x-direction in FIG. 2(b), the electric current $I_e$ flows in the y-direction in the $IrO_2$ wire in FIG. 2(b).

Figure 4:
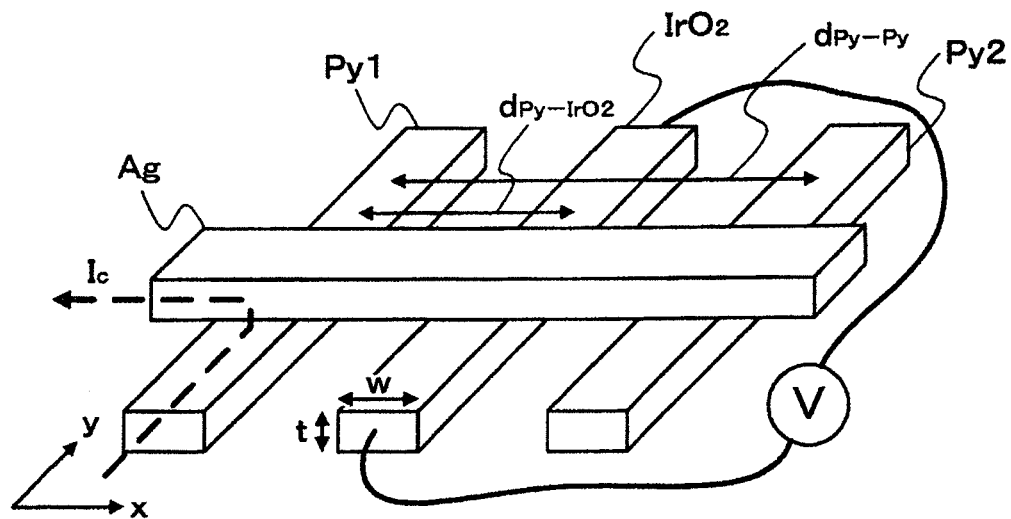
FIG. 4 is a schematic diagram showing an exemplary device for detecting the inverse spin Hall effect.

The inventors of the present invention made a device shown in FIG. 4 and detected the inverse spin Hall effect of $IrO_2$ by measuring the potential difference between the both ends of the $IrO_2$ wire. The values of the thickness t and the width w of the $IrO_2$ wire, the electric current $I_c$, the distance $d_{py-py}$ from the point of connection of the Ag wire and the Py1 wire to the point of connection of the Ag wire and the Py2 wire, and the distance $d_{py-IrO2}$ from the point of connection of the Ag wire and the Py1 wire to the point of connection of the Ag wire and the $IrO_2$ wire were the same as the values in the experiment shown in FIGS. 2 and 3.

Figure 5:
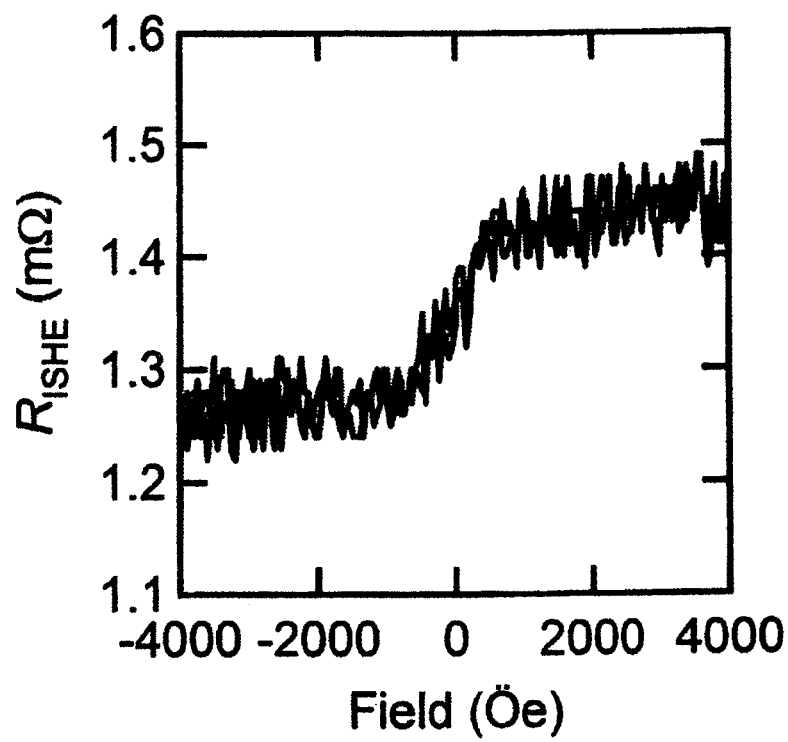
FIG. 5 shows an exemplary result of detection of the inverse spin Hall effect.

FIG. 5 shows the result of an experiment performed using the device shown in FIG. 4. In FIG. 5, the horizontal axis (Field) represents the intensity of the magnetic field in the x-direction in FIG. 4, and the vertical axis ($R_{ISHE}$) represents the value of the measured potential difference divided by the supplied electric current $I_c$.

As shown in FIG. 5, we observed the phenomenon of reversal of the voltage polarity with reversal of the direction of the magnetic field, namely with reversal of the direction of magnetization of the injected spin current. This result fits formula (1). Thus, the inverse spin Hall effect of $IrO_2$ was detected.

(Calculation of Spin Hall Resistivity and Spin Hall Angle)

In the experiment shown in FIGS. 4 and 5, the variation $\Delta V$ of the measured potential difference is expressed by the following equation (3):

[Math. 4]

$$\Delta V = I_c \Delta R_{ISHE} = \frac{\rho_{SHE}}{w} I_S, \quad (3)$$

where $I_c$ is the current flowing in the Py1 wire, and w is the width of the $IrO_2$ wire.

In equation (3), $\Delta R_{ISHE}$ is the value of the potential difference generated in $IrO_2$ by the inverse spin Hall effect (spin Hall effect) divided by the current $I_c$ flowing in the Py1 wire, which is the height difference between the plateaus of the curve in FIG. 5. In the experiment shown in FIGS. 4 and 5, $\Delta R_{ISHE}$ was approximately equal to 0.18 m$\Omega$.

In equation (3), $I_s$ is the amount of spin current absorbed by the $IrO_2$ wire, which can be calculated using the following equation (4) on the basis of the experiment shown in FIGS. 2 and 3 (non-patent document 6).

[Math. 5]

$$I_S \approx \frac{\alpha_{Py1} R_{Py1} I_c}{(R_{Py1} + R_{IrO2})\cosh\left(\frac{d_{Py-Py}}{\lambda_{Ag}}\right) + (R_{Py1} + R_{Ag})\sinh\left(\frac{d_{Py-Py}}{\lambda_{Ag}}\right)}, \quad (4)$$

where $\alpha_{Py1}$ is the spin polarization ratio of Py1. In this embodiment, the value of $\alpha_{Py1}$ was 0.26.

In equation (3) $\rho_{SHE}$ is the spin Hall resistivity of $IrO_2$, which is a value indicative of the efficiency of conversion between the spin current and the potential difference (or the electric current) (or indicative of the magnitude of the spin Hall effect or the inverse spin Hall effect). (Specifically, the higher $\rho_{SHE}$ is, the higher the conversion efficiency is.) From equations (3) and (4), the value of the spin Hall resistivity $\rho_{SHE}$ of $IrO_2$ was calculated to be $9.3\times10^{-9}$ $\Omega$m, which is approximately 16 times that of Pt (which is $5.77\times10^{-10}$ $\Omega$m, according to non-patent document 2). This suggests that $IrO_2$ is a promising material for use in electric current-spin current conversion devices.

The spin Hall angle $\alpha$ may be used in discussing the spin Hall effect and the inverse spin Hall effect. The spin Hall angle $\alpha$ is an index indicative of the degree to which electrons flowing in a material are deflected by the spin-orbit interaction, and larger spin Hall angles are preferable. The spin Hall angle $\alpha$ can be calculated by the following equation (5).

[Math. 6]

$$\alpha = \frac{\rho_{SHE}}{\rho_{IrO2}} \quad (5)$$

From equation (5), the value of the spin Hall angle $\alpha$ of $IrO_2$ was calculated to be 0.0047, which is approximately 1.3 times that of Pt (which is 0.0037, according to non-patent document 2). This suggests that $IrO_2$ is a promising material for use in electric current-spin current conversion devices.

As will be understood from the foregoing description, $IrO_2$ is a material having a very high spin Hall resistivity and large spin Hall angle as compared to Pt. Therefore, electric current-spin current conversion devices with high conversion efficiency can be obtained by using $IrO_2$.

The inventors of the present invention considered the reason why $IrO_2$ has a high spin Hall resistivity and large spin Hall angle (namely the reason why the magnitude of the spin Hall effect and the inverse spin Hall effect or the efficiency of conversion between electric current and spin current is high with $IrO_2$) and found that 5d transition metal oxides are promising materials for use in electric current-spin current conversion devices. This will be described specifically in the following.

It is considered that the spin-orbit interaction is relevant to the mechanism of the deflection of charge current and spin current. Specifically, the spin current is not deflected in materials in which the Fermi surface is constituted by the s orbital, with which spin-orbit interactions do not arise. On the other hand, the spin current is greatly deflected in materials in which the Fermi surface is constituted by an electron orbital with which a strong spin-orbit interaction arises, such as the 5d orbital. Therefore, it is considered that the 5d orbital greatly contributes to the spin Hall effect (and the inverse spin Hall effect).

In the 5d metals such as Pt, the Fermi surface is constituted by a hybrid orbital of the 6s orbital and the 5d orbital. It is considered, therefore, that the 6s orbital, with which spin-orbit interactions do not arise, weakens the deflection of spins, thereby decreasing the conversion efficiency.

On the other hand, in the case of $IrO_2$, the Fermi surface is constituted only by the 5d orbital, which is considered to be the reason why a high conversion efficiency was achieved with $IrO_2$. In other words, materials in which the Fermi surface is constituted only by the 5d orbital can be expected to show a high conversion efficiency, and 5d transition metal oxides are promising material for use in electric current-spin current conversion devices. Examples of 5d transition metal oxides include $ReO_3$, $SrIrO_3$, $CaIrO_3$, $BaIrO_3$, and $M_xWO_3$ (M is H, Li, Na, K, Rb, Cs, Ca, Sr, Ba, Ce, Eu, or Gd, and x=0.05-0.15). In the above experiments, polycrystalline $IrO_2$ and amorphous $IrO_2$ were used (FIGS. 3 and 5 show data in the case where polycrystalline $IrO_2$ was used). A further enhancement in the efficiency can be expected to be achieved by the use of monocrystalline $IrO_2$, because materials have a lower electric resistivity in a monocrystaline form than in a polycrystalline or amorphous form.

<Apparatus Using Electric Current-Spin Current Conversion Device>

In the following, a concrete exemplary apparatus using the above-described electric current-spin current conversion device will be described. While a case where a device made of $IrO_2$ is used as an electric current-spin current conversion device will be described in the following, the material of the device is not limited to $IrO_2$ but may be other 5d transition metal oxides.

(Spin Accumulation Apparatus)

Figure 6:
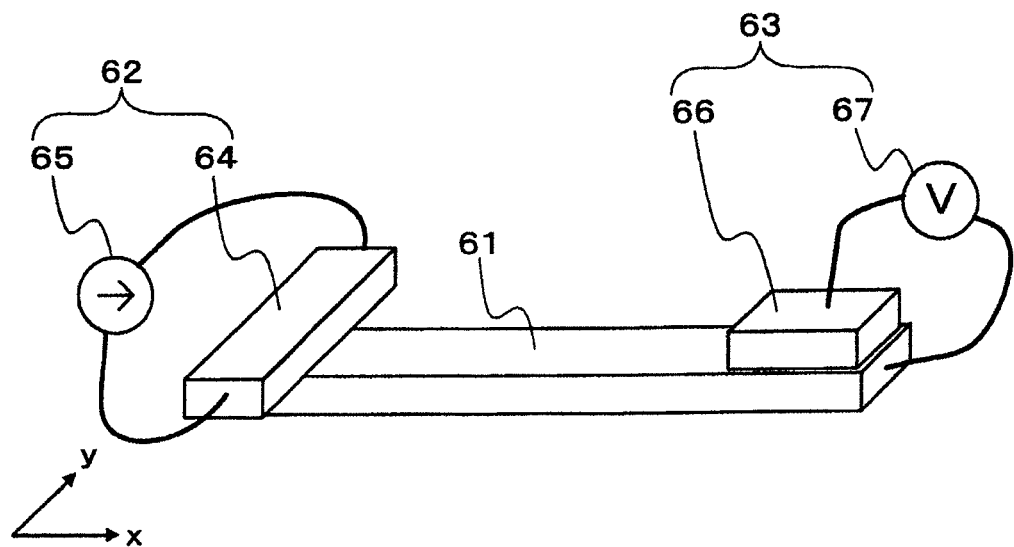
FIG. 6 is a schematic diagram showing an exemplary construction of a spin accumulation apparatus according to an embodiment.

FIG. 6 is a schematic diagram showing an exemplary construction of a spin accumulation apparatus according to an embodiment. The spin accumulation apparatus according to the embodiment accumulates spins in a non-magnetic body utilizing the spin Hall effect (conversion of electric current into spin current) of $IrO_2$. In the following, the construction of the spin accumulation apparatus will be described in detail with reference to FIG. 6.

The spin accumulation apparatus includes a non-magnetic body for spin accumulation (accumulation part 61) in which injected spins are accumulated and an injection part 62 that injects spins into the non-magnetic body. In the exemplary case shown in FIG. 6, the spin accumulation apparatus further includes a magnetic field detection part 63.

The accumulation part 61 has a plate-like shape.

The spin injection part 62 includes an $IrO_2$ part ($IrO_2$ wire 64) provided on the accumulation part 61 (on one surface of the accumulation part 61) and an electric power source 65 that supplies an electric current to the IrO$_2$ wire 64 so that a spin current flowing toward the accumulation part 61 is generated by the spin Hall effect. Specifically, as the electric power source 65 supplies an electric current flowing in the wiring direction (the y-direction in FIG. 6) of the IrO$_2$ wire 64, a spin current flowing toward the accumulation part 61 is generated in the IrO$_2$ wire 64. The spin current generated in the IrO$_2$ wire 64 flows into the accumulation part 61. Thus, spins can be accumulated in the accumulation part 61. The direction of the spin current and the direction of the spins can be controlled by the direction of the electric current.

The magnetic field detection part 63 includes a ferromagnetic body 66 (ferromagnetic electrode) provided on the accumulation part 61 and a sensor 67 that senses the magnetic field. Specifically, the spin current flowing in the accumulation part 61 flows into the ferromagnetic body 66. Then, the sensor 67 (which is a voltmeter) measures the potential difference between the ferromagnetic body 66 and the accumulation part 61. The measurement of this potential difference can give the measurement of the difference in the chemical potential between the ferromagnetic body 66 and the accumulation part 61. The potential difference thus measured depends on the relative angle formed by the direction of magnetization in the ferromagnetic body 66 and the direction of accumulated spins. In the case where this apparatus is used as a magnetic field sensor, a medium for which the measurement is to be performed is brought into contact with the end face of the ferromagnetic body 66 and the end face of the accumulation part 61. Then, a leakage magnetic field from the medium will cause a change in the direction of magnetization of the ferromagnetic body 66, which can be detected as a change in the potential difference. The magnitude of the magnetic field derived from the medium can be calculated from the change in the potential difference.

It is desirable that the material of the accumulation part 61 be a material having a large spin relaxation length, which may be a metal such as Al, Mg, Cu, or Ag, an alloy thereof, a semiconductor such as Si, Ge, or GaAs, or a superconductor such as Al or Nb.

It is necessary that the distance L6 between the IrO$_2$ wire 64 and the ferromagnetic body 66 be not larger than the spin relaxation length of the non-magnetic material 61. For example, at ambient temperature, the spin relaxation length of Cu is approximately 300 nm, the spin relaxation length of Au is approximately 50 nm, and the spin relaxation length of Al is approximately 400 nm. It is preferred that the distance L6 between the IrO$_2$ wire 64 and the ferromagnetic body 66 be shorter, because a shorter distance L6 will lead to a larger potential difference to be detected.

The materials that can be used as the material of the ferromagnetic body 66 include Ni, Fe, Co, alloys thereof, amorphous materials such as Co—Fe—B, Heusler materials such as Co—Mn—Si and Co—Cr—Fe—Al, oxides such as La—Sr—Mn—O, and ferromagnetic semiconductor materials such as GaMnAs.

Non-magnetic elements such as Ti, V, Cr, Mn, Cu, Zn, B, Al, Ga, C, Si, Ge, Sn, N, P, Sb, O, S, Mo, Ru, Ag, Hf, Ta, W, Ir, Pt, and Au may be added to the above-mentioned materials as necessary in order to control magnetic characteristics and chemical properties.

The ferromagnetic body 66 may be a ferromagnetic thin film made of one of the above-mentioned materials or a multi-layer thin film made up of multiple kinds of thin film layers that are laminated together.

It is preferred that the film thickness d6 of the ferromagnetic body 66 be not smaller than 2 nm, in view of noises in measuring the potential difference and magnetic characteristics.

(Spin Accumulation Amount Measuring Apparatus)

Figure 7:
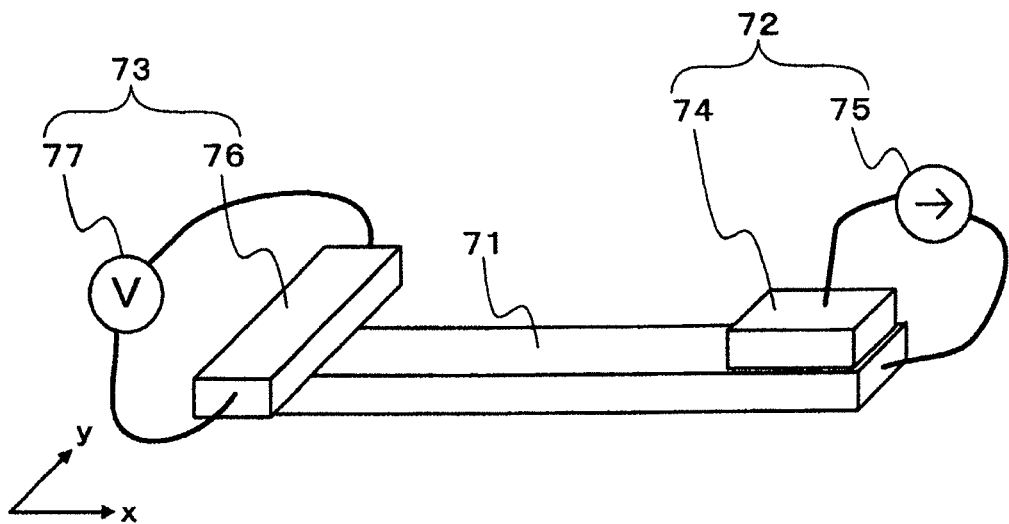
FIG. 7 is a schematic diagram showing an exemplary construction of a spin accumulation amount measuring apparatus according to an embodiment.

FIG. 7 is a schematic diagram showing an exemplary construction of a spin accumulation amount measuring apparatus according to an embodiment. The spin accumulation amount measuring apparatus according to this embodiment measures the amount of spins (spin accumulation amount) accumulated in a non-magnetic body utilizing the inverse spin Hall effect (conversion of spin current into electric current) of IrO$_2$. In the following, the construction of the spin accumulation amount measuring apparatus will be described specifically with reference to FIG. 7.

The spin accumulation amount measuring apparatus includes a non-magnetic body for accumulation (accumulation part 71) in which injected spins are accumulated, an injection part 72 that injects spins into the accumulation part 71, and a detection part 73 that measures the spin accumulation amount in the accumulation part 71.

The accumulation part 71 has a plate-like shape.

The spin injection part 72 has a ferromagnetic body 74 provided on the accumulation part 71 (on one surface of the accumulation part 71) and an electric power source 75 that supplies an electric current in such a way that electrons flow from the ferromagnetic body 74 to the accumulation part 71. The injection of spin polarized electrons in the ferromagnetic body into the accumulation part 71 can cause a spin current and spin accumulation in the accumulation part 71.

The detection part 73 includes an IrO$_2$ part (IrO$_2$ wire 76) provided on the accumulation part 71 (on one surface of the accumulation part 71) and a sensor 77 that measures, as the spin amount (or the spin accumulation amount), an electric current generated by the inverse spin Hall effect of IrO$_2$. Specifically, the spin current flowing in the accumulation part 71 flows into the IrO$_2$ wire 76 and is converted into the electric current by the inverse spin Hall effect of IrO$_2$ (which generates a potential difference between both ends of the IrO$_2$ wire). Then, the sensor 77 (which is a voltmeter) measures the potential difference between both ends of the IrO$_2$ wire 76. The potential difference thus measured depends on the spin accumulation amount in the accumulation part 71 and the direction of the spin.

The electric power source 75 (constant-current power supply) is used to inject spins from the ferromagnetic body 74 to the accumulation part 71. The direction of the spins injected to and accumulated in the accumulation part 71 is the same as the direction of magnetization of the ferromagnetic body 74. In the case where this apparatus is used as a magnetic field sensor, a medium for which the measurement is to be performed is brought into contact with the end face of the ferromagnetic body 74 and the end face of the accumulation part 71. Then, a magnetic field derived from the medium will cause a change in the direction of magnetization of the ferromagnetic body 74, consequently leading to a change in the direction of spins accumulated in the accumulation part 71. Hence a change in the direction of the spin current flowing into IrO$_2$, which can be detected as a change in the potential difference. The magnitude of the magnetic field derived from the medium can be calculated from the change in the potential difference.

It is desirable that the material of the accumulation part 71 be a material having a large spin relaxation length, which may be a metal such as Al, Mg, Cu, or Ag, an alloy thereof, a semiconductor such as Si, Ge, or GaAs, or a superconductor such as Al or Nb.

It is necessary that the distance L7 between the $IrO_2$ wire 76 and the ferromagnetic body 74 be not larger than the spin relaxation length of the non-magnetic material 71. For example, at ambient temperature, the spin relaxation length of Cu is approximately 300 nm, the spin relaxation length of Au is approximately 50 nm, and the spin relaxation length of Al is approximately 400 nm. It is preferred that the distance L7 between the $IrO_2$ wire 76 and the ferromagnetic body 74 be shorter, because a shorter distance L7 will lead to a larger potential difference to be detected.

The materials that can be used as the material of the ferromagnetic body 74 include Ni, Fe, Co, alloys thereof, amorphous materials such as Co—Fe—B, Heusler materials such as Co—Mn—Si and Co—Cr—Fe—Al, oxides such as La—Sr—Mn—O, and ferromagnetic semiconductor materials such as GaMnAs.

Non-magnetic elements such as Ti, V, Cr, Mn, Cu, Zn, B, Al, Ga, C, Si, Ge, Sn, N, P, Sb, O, S, Mo, Ru, Ag, Hf, Ta, W, Ir, Pt, and Au may be added to the above-mentioned materials as necessary in order to control magnetic characteristics and chemical properties.

The ferromagnetic body 74 may be a ferromagnetic thin film made of one of the above-mentioned materials or a multi-layer thin film made up of multiple kinds of thin film layers that are laminated together.

It is preferred that the film thickness d7 of the ferromagnetic body 74 be not smaller than 2 nm, in view of noises in measuring the potential difference and magnetic characteristics.

(High Frequency Spin Wave Generating Apparatus)

Figure 8:
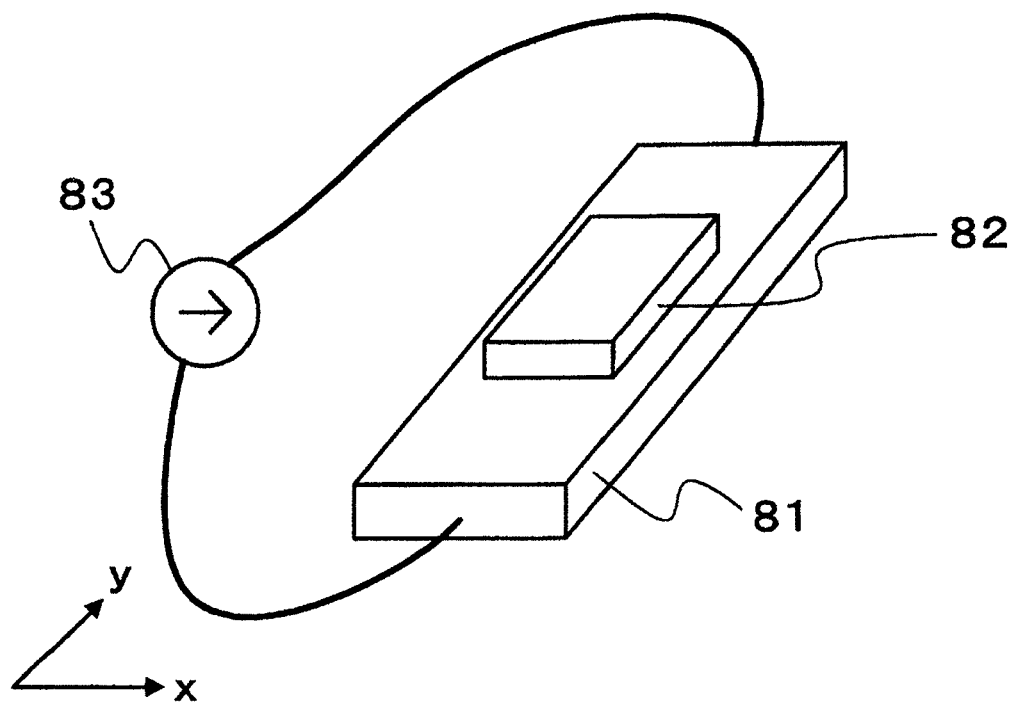
FIG. 8 is a schematic diagram showing an exemplary construction of a high frequency spin wave generating apparatus according to an embodiment.

FIG. 8 is a schematic diagram showing an exemplary construction of a high frequency spin wave generating apparatus according to an embodiment. The high frequency spin wave generating apparatus according to this embodiment generates a spin wave in a magnetic body or a high frequency electromagnetic wave utilizing the spin Hall effect (conversion of electric current into spin current) of $IrO_2$. In the following, the construction of the high frequency spin wave generating apparatus will be described specifically with reference to FIG. 8.

The high frequency spin wave generating apparatus includes a plate-like $IrO_2$ wire 81, a magnetic body 82 provided on the $IrO_2$ wire 81 (on one surface of the $IrO_2$ wire 81), and an electric power source 83 (current source) that supplies an electric current to the $IrO_2$ wire 64 so that a spin current flowing toward the magnetic body 82 is generated by the spin Hall effect. Specifically, as the electric power source 83 supplies an electric current flowing in the wiring direction (the y-direction in FIG. 8) of the $IrO_2$ wire 81, a spin current flowing toward the magnetic body 82 is generated in the $IrO_2$ wire. The direction of spin of the spin current can be controlled by the direction of the electric current.

If the magnetic body 82 is electrically conductive, the spin current generated in $IrO_2$ flows into the magnetic body 82. Interaction of the spin current and localized spins in the magnetic body 82 generates a torque in the localized spins (spin torque). This spin torque causes a precession of the magnetization of the magnetic body 82 at a characteristic frequency of the magnetic body 82. By the precession, a high frequency electromagnetic wave is generated, or a spin wave is generated in the magnetic body 82.

If the magnetic body 82 is electrically insulative, spin-orbit interaction with respect to the spin current generated in $IrO_2$ is transferred at the interface of $IrO_2$ and the magnetic body 82, causing a precession of the magnetization of the magnetic body 82. By the precession, a high frequency electromagnetic wave is generated, or a spin wave is generated in the magnetic body.

The characteristic frequency of the precession can be selectively set in a range from sub gigahertz to several tens gigahertz by changing the material and shape of the magnetic body 82.

A magnetic field may be applied to the high frequency spin wave generating apparatus to achieve stable self-oscillation and to change the frequency externally.

The magnetic body 82 may be a ferromagnetic body, an antiferromagnetic body, or a magneto-dielectric body represented by ferrite. Usable ferromagnetic materials include Ni, Fe, Co, alloys thereof, amorphous materials such as Co—Fe—B, Heusler materials such as Co—Mn—Si and Co—Cr—Fe—Al, oxides such as La—Sr—Mn—O, and ferromagnetic semiconductor materials such as GaMnAs. Usable antiferromagnetic materials include Mn, Cr, alloys thereof, and oxides such as Co—O and Ni—O.

Non-magnetic elements such as Ti, V, Cr, Mn, Cu, Zn, B, Al, Ga, C, Si, Ge, Sn, N, P, Sb, O, S, Mo, Ru, Ag, Hf, Ta, W, Ir, Pt, and Au may be added to the above-mentioned materials as necessary in order to control magnetic characteristics and chemical properties.

The magnetic body 82 may be a magnetic thin film made of one of the above-mentioned materials or a multi-layer thin film made up of multiple kinds of thin film layers that are laminated together.

(Spin Wave Detection Apparatus)

Figure 9:
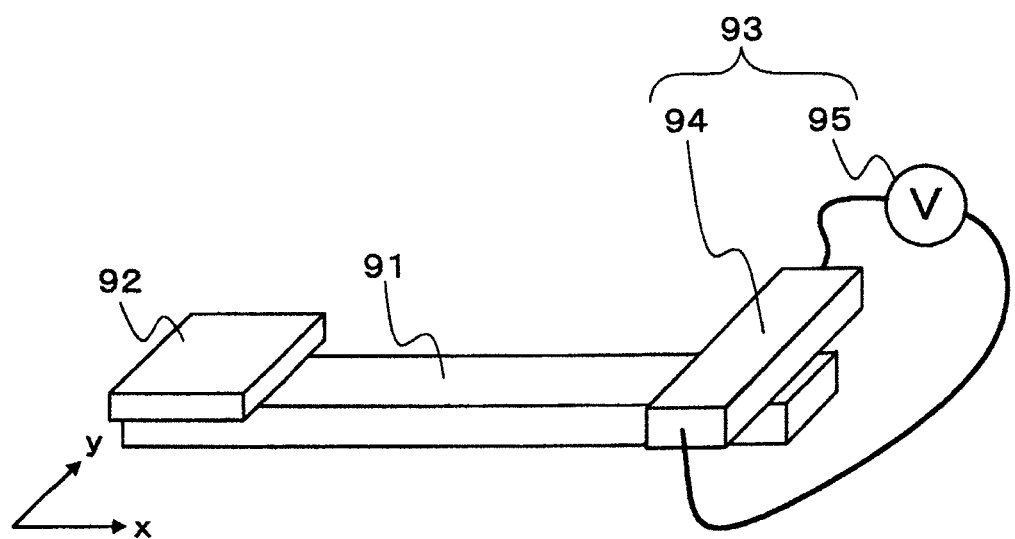
FIG. 9 is a schematic diagram showing an exemplary construction of a spin wave detection apparatus according to an embodiment.

FIG. 9 is a schematic diagram showing an exemplary construction of a spin wave detection apparatus according to an embodiment. The spin wave detection apparatus according to this embodiment detects a spin wave utilizing the inverse spin Hall effect (conversion of spin current into electric current) of $IrO_2$. In the following, the construction of the spin wave detection apparatus will be described specifically with reference to FIG. 9.

The spin wave detection apparatus includes a plate-like magnetic body 91, a supply part 92 that supplies energy for generating a spin wave in the magnetic body 91, and a detection part 93 that detects the spin wave generated in the magnetic body 91. In the exemplary case shown in FIG. 9, the supply part 92 is provided on the magnetic body 91 (on one surface of the magnetic body 91).

The supply part 92 locally supplies energy to the magnetic body 91, whereby a spin wave is generated in the magnetic body 91. The energy may be thermal energy supplied by laser light, magnetostatic energy supplied by application of a pulsed magnetic field, or spin torque energy supplied utilizing a spin current.

The detection part 93 includes an $IrO_2$ wire 94 provided on the magnetic body 91 (on one surface of the magnetic body 91) and a sensor 95 that measures, as the spin wave, an electric current generated by the inverse spin Hall effect of the $IrO_2$ wire.

In the magnetic body 91 in thermal equilibrium, the directions of spins are regularly arranged by exchange interaction. With supply of energy, the spin arrangement is locally disturbed. Then, a spin wave is generated by exchange interaction between adjoining spins. The spin wave thus generated propagates in the magnetic body 91.

The propagating spin wave eventually reaches the $IrO_2$ wire, and the spin wave in the magnetic body 91 is quickly attenuated by interaction at the contact interface of the $IrO_2$ wire 94 and the magnetic body 91. In addition, spin-orbit interaction is transferred at this contact interface, so that the spin wave flows into the $IrO_2$ wire 94 as a spin current. The spin current is converted into an electric current by the inverse spin Hall effect, which is measured by the sensor 95 as a potential difference. Thus, the spin wave is detected as a potential difference.

The magnetic body 91 may be a ferromagnetic body, an antiferromagnetic body, or a magneto-dielectric body represented by ferrite. Usable ferromagnetic materials include Ni, Fe, Co, alloys thereof, amorphous materials such as Co—Fe—B, Heusler materials such as Co—Mn—Si and Co—Cr—Fe—Al, oxides such as La—Sr—Mn—O, and ferromagnetic semiconductor materials such as GaMnAs. Usable antiferromagnetic materials include Mn, Cr, alloys thereof, and oxides such as Co—O and Ni—O.

Non-magnetic elements such as Ti, V, Cr, Mn, Cu, Zn, B, Al, Ga, C, Si, Ge, Sn, N, P, Sb, O, S, Mo, Ru, Ag, Hf, Ta, W, Ir, Pt, and Au may be added to the above-mentioned materials as necessary in order to control magnetic characteristics and chemical properties.

As described in the foregoing, according to the embodiment, there can be provided an electric current-spin current conversion device with high conversion efficiency by performing conversion between electric current and spin current utilizing the spin Hall effect or the inverse spin Hall effect of a 5d transition metal oxide.

As described above, the electric current-spin current conversion device according to the embodiment can be used in place of a conventionally used ferromagnetic body in a spin accumulation apparatus, a spin accumulation amount measuring apparatus or the like. Thus, there can be provided an apparatus free from the problem of magnetostatic coupling or the problem of a leakage magnetic field through an end of the ferromagnetic body.

Moreover, because apparatuses (or logic elements) such as the above-described high frequency spin wave generating apparatus and the spin wave detection apparatus enables high speed transmission of information, they are considered to be promising as ultra high speed information processing elements. While the high frequency spin wave generating apparatus and the spin wave detection apparatus have been described by way of example, various apparatuses can be provided by combining them.

REFERENCE SIGNS LIST

61, 71: accumulation part
62, 72: spin injection part
63: magnetic field detection part
64, 76, 81, 94: wire
65, 75, 83: electric power source
66, 74: ferromagnetic body
67, 77, 95: sensor
73, 93: detection part
82, 91: magnetic body
92: supply part

The invention claimed is:

1. An electric current-spin current conversion device characterized by performing conversion between electric current and spin current utilizing the spin Hall effect or the inverse spin Hall effect of a 5d transition metal oxide.

2. An electric current-spin current conversion device according to claim 1, characterized in that said 5d transition metal oxide contains Ir.

3. A spin wave detection apparatus characterized by comprising:
   a magnetic body;
   a supply unit that supplies energy for generating a spin wave in said magnetic body; and
   a detection unit that detects the spin wave generated in said magnetic body;
   wherein said detection unit comprises an electric current-spin current conversion device according to claim 1 or 2 provided on said magnetic body, and a sensor that detects, as said spin wave, electric current generated by the inverse spin Hall effect of the electric current-spin current conversion device.

4. An electric current-spin current conversion device according to claim 1, wherein the 5d transition metal oxide includes at least one of the following: $ReO_3$, $SrIrO_3$, $CaIrO_3$, $BaIrO_3$, and $M_xWO_3$ (M is H, Li, Na, K, Rb, Cs, Ca, Sr, Ba, Ce, Eu, or Gd, and x=0.05-0.15).

* * * * *